US 6,682,953 B2

(12) United States Patent
Sakai et al.

(10) Patent No.: US 6,682,953 B2
(45) Date of Patent: Jan. 27, 2004

(54) METHOD FOR MAKING A MOUNTING STRUCTURE FOR AN ELECTRONIC COMPONENT HAVING AN EXTERNAL TERMINAL ELECTRODE

(75) Inventors: Norio Sakai, Moriyama (JP); Kazuhiro Iida, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/400,026

(22) Filed: Mar. 26, 2003

(65) Prior Publication Data
US 2003/0157749 A1 Aug. 21, 2003

Related U.S. Application Data

(62) Division of application No. 09/863,130, filed on May 23, 2001, now Pat. No. 6,576,999.

(30) Foreign Application Priority Data
Jul. 6, 2000 (JP) ....................................... 2000-204994

(51) Int. Cl.$^7$ ............................................... H01L 21/44
(52) U.S. Cl. ...................... 438/106; 438/125; 257/673; 257/678
(58) Field of Search ................................ 438/106, 125, 438/637, 618; 331/68, 736; 257/768, 730; 310/348

(56) References Cited

U.S. PATENT DOCUMENTS

| 5,493,769 A | * | 2/1996 | Sakai et al. .................... 29/593 |
| 5,500,628 A | | 3/1996 | Knecht et al. |
| 5,635,670 A | * | 6/1997 | Kubota et al. ............. 174/52.1 |
| 5,644,107 A | | 7/1997 | Kubota et al. |
| 5,949,294 A | | 9/1999 | Kondo et al. |

FOREIGN PATENT DOCUMENTS

| JP | 06-096992 | 4/1994 |
| JP | 08-037251 | 2/1996 |

* cited by examiner

Primary Examiner—Van Thu Nguyen
Assistant Examiner—Bradley Smith
(74) Attorney, Agent, or Firm—Keating & Bennett, LLP

(57) ABSTRACT

A method for manufacturing an electronic component includes forming an aggregate electronic component including a plurality of electronic components and dividing the aggregate electronic component to separate the plurality of electronic components to form individual electronic components. Through-holes are formed in a laminated body providing an aggregate electronic component wherein via-hole conductors are arranged so as not pass through the aggregate electronic component in a thickness direction thereof, the via-hole conductors are divided by the through-holes, and each divided portion provides an external terminal electrode. Then, by dividing the laminated body along the dividing lines passing through the through-holes, a plurality of individual electronic components are produced.

9 Claims, 7 Drawing Sheets

FIG. 4A
FIG. 4B
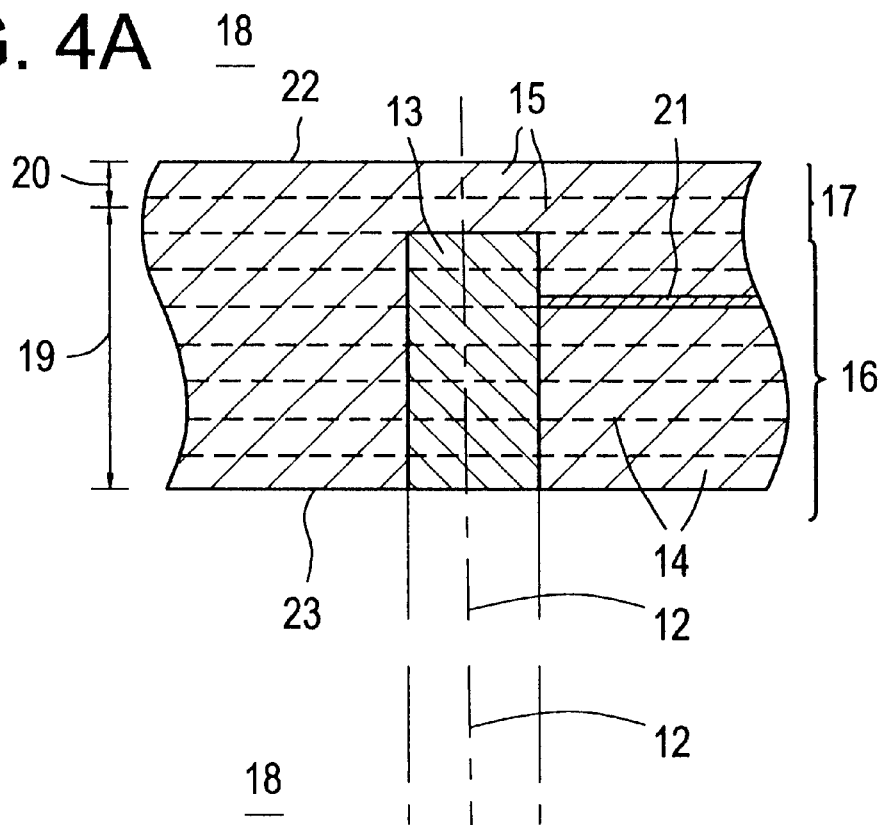
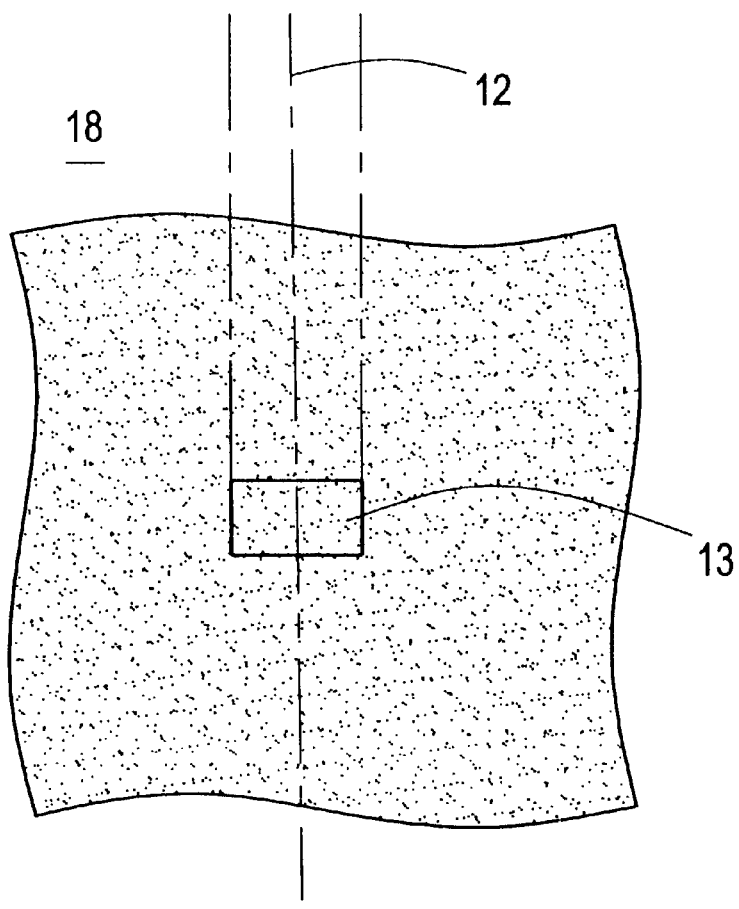

METHOD FOR MAKING A MOUNTING STRUCTURE FOR AN ELECTRONIC COMPONENT HAVING AN EXTERNAL TERMINAL ELECTRODE

This application is a Divisional of U.S. patent application Ser. No. 09/863,130, filed May 23, 2001, now U.S. Pat. No. 6,576,999.

BACKGROUND OF THE INVENTION

1. Field of the Invention

The present invention relates to an electronic component, a manufacturing method thereof, an aggregate electronic component, a mounting structure of an electronic component, and an electronic device, and more particularly, the present invention relates to an improvement in the formation and structure of an external terminal electrode.

2. Description of the Related Art

A prior art which is related to the present invention is disclosed in Japanese Unexamined Patent Application Publication No. 08-37251. Hereinafter, this is referred to as the "first prior art".

This first prior art relates to a laminated electronic component and a manufacturing method therefor. The first prior art is characterized in that first, an aggregate electronic component is produced, and then, a plurality of electronic components are produced from the aggregate electronic component by dividing the aggregate electronic component along dividing lines.

More specifically, a laminated body is produced by laminating a plurality of dielectric sheets having via-hole conductors formed therein, then through-holes passing through the laminated body are formed at locations of the via-hole conductors, thereby the via-hole conductors are divided, and a portion of each of the via-hole conductors is caused to be exposed to the inner surface of the through-hole. Next, by dividing the laminated body along dividing lines passing through the through-holes, electronic components are removed and produced such that each of the electronic components has external terminal electrodes each constituted of a portion of the via-hole conductor.

In accordance with the first prior art, external terminal electrodes can be easily formed even if the arrangement pitch is fine, and the characteristics of the individual electronic components which exist at the stage of a laminated body when it is in the state of an aggregate electronic component, can be measured.

Another prior art which is related to the present invention is disclosed in Japanese Unexamined Patent Application Publication No. 06-96992. Hereinafter, this is referred to as the "second prior art".

This second prior art also relates to a laminated electronic component and a manufacturing method therefor. As in the case of the first prior art, the second prior art is characterized in that firstly an aggregate electronic component is produced, and that a plurality of electronic components is removed from the aggregate electronic component by dividing the aggregate electronic component along dividing lines.

More specifically, a laminated body is produced by laminating a first dielectric sheet which has via-hole conductors defining external terminal electrodes formed therein, and a second dielectric sheet which does not via-hole conductors formed therein, then grooves are formed so as to divide the via-hole conductors, and thereby a portion of each of the via-hole conductors is caused to be exposed to the inner surface of the groove. Next, by dividing the laminated body along the grooves, electronic components are produced such that each of the electronic components are provided with external terminal electrodes each constituted of a portion of the via-hole conductor.

In accordance with the second prior art, as in the case of the first prior art, external terminal electrodes can be easily formed even if the arrangement pitch is fine, and measurement of the characteristics of the individual electronic components can be measured at the stage of a laminated body in the state of an aggregate electronic component.

In the first prior art, there are provided external terminal electrodes each having a length that is equivalent to that of the through-hole formed in the laminated body. In contrast, in the second prior art, the external terminal electrodes have a length that is within the range of the depth of each of the grooves, the depth of each of the grooves corresponding to a portion of the thickness of the laminated body.

However, each of the first and second prior arts presents problems to be solved.

First, in the first prior art, since each of the external terminal electrodes has a length that is equivalent to that of each of the through-holes formed in the laminated body, the external terminal electrodes are arranged so as to reach both of first and second main surface. Therefore, for example, when using the first main surface as a mounting surface for mounting components, a predetermined space must be provided between external terminal electrodes and connection terminals for the mounted components when soldering the mounded component, in order to prevent short circuits between the mounted components and the external terminal electrodes. This greatly reduces the area in which mounted components can be mounted.

Likewise, in the case where this electronic component is mounted on a mother circuit board, when the second main surface is arranged to face the mother circuit board, it is necessary to prevent solder or other such connecting material used for connecting external terminal electrodes and the mother circuit board from causing an undesirable electrical short circuit between wiring conductors and the external terminal electrodes on the second main surface. For this purpose, a predetermined space must be provided between the wiring conductors and the external terminal electrodes. This also leads to a reduction in the mountable area for wiring conductors on the second main surface.

Furthermore, when the electronic component is a ceramic electronic component that is manufactured through a firing process, irregularities or uneven portions occur in the vicinity of external terminal electrodes on the main surfaces of the electronic component due to a difference in the shrinkage during firing between the via-hole conductors and the ceramic. As a result, when wire-bonding mounting or flip-chip mounting is performed, each of which is usually required to provide a co planarity of not more than 20 $\mu$m, it is impossible to properly perform mounting in the vicinity of the external terminal electrodes. This also causes a reduction in the mountable area for mounted components.

When an electronic component is mounted on a mother circuit board via solder, solder fillets are formed between the external terminal electrodes of the electronic component and the connection terminals of the mother circuit board. When the electronic component is used for a high-frequency application, these solder fillets function as inductance components which cannot be ignored, and hence, the control over the height of fillets is important. The height of the fillet is determined by the amount of solder used and the wettability of the solder with respect to the surface of the external terminal electrodes. However, if the external terminal electrodes are provided so as to pass through in the thickness direction of the electronic component, the height of fillets will be difficult to control, and hence, when the electronic component is used for a high-frequency application, the inductance component due to solder fillets varies.

The above-described problems which are experienced with the first prior art can be solved to some extent by using the method of the second prior art. This is because, in accordance with the second prior art, the external terminal electrode is not arranged so as to pass through in the thickness direction of the electronic component, but is arranged so as to reach only one of the main surfaces.

However, the second prior art has the following problem.

Even at the stage of a laminated body in the state of an aggregate electronic component, in order to allow characteristics of individual electronic components to be measured, external terminal electrodes for the individual electronic components are made to be independent of one another by dividing the via-hole conductors. Such division of the via-hole conductors is achieved by forming grooves along dividing lines for dividing via-hole conductors so as to remove and separate the individual electronic components.

However, such grooves can produce or cause inadvertently breakable places in an aggregate electronic component, and the aggregate electronic component can be undesirably broken during the process of treating the aggregate electronic component to perform the operation of measuring characteristics thereof, or other processing steps. Such a breakage is more prone to occur when the thickness is reduced to e.g. about 0.8 mm, under the circumstance where the thinning of electronic component is progressing.

SUMMARY OF THE INVENTION

In order to overcome the problems described above, preferred embodiments of the present invention provide an electronic component, a manufacturing method therefor, and an aggregate electronic component all of which solve the above-described problems by forming an electronic device using of a mounting structure of an electronic component.

According to a first preferred embodiment of the present invention, a method for manufacturing an electronic component includes the steps of producing a laminated body by laminating a first dielectric-layer portion which has a first thickness and which has via-hole conductors defining external terminal electrodes formed therein, and a second dielectric-layer portion which has a second thickness and which does not have via-hole conductors formed therein at the portions where the via-hole conductors of said first dielectric-layer portion are positioned, forming through-holes which pass through mutually opposed first and second main surfaces of the laminated body, at the portions where the via-hole conductors of the laminated body are positioned, and thereby causing a portion of each of the via-hole conductor to be exposed at the inner surface of the through-hole, and dividing the laminated body along dividing lines passing through the through-holes so as to remove individual electronic components each including external terminal electrodes each of which includes a portion of the via-hole conductor.

In the method of manufacturing an electronic component according to this preferred embodiment of the present invention, it is preferable that the laminated body is an aggregate electronic component which is arranged so that a plurality of electronic components can be removed therefrom by dividing the laminated body along the dividing lines. In this case, the step of forming through-holes and the step of dividing the laminated body are performed on the aggregate electronic component, and in the step of forming through-holes, through-holes are formed so as to each divide the via-hole conductors. By dividing this aggregate electronic component, a plurality of the electronic components is removed from the aggregate electronic component.

In the above-described preferred embodiment, it is preferable that the step of measuring characteristics of each of the electronic components in the state of the aggregate electronic component is performed before the step of dividing the aggregate electronic component.

When each of the above-described first and second dielectric-sheets are constituted of ceramic green sheets, the manufacturing method for an electronic component further includes the step of firing the laminated body.

In the manufacturing method for an electronic component in accordance with the present preferred embodiment of the present invention, the first thickness preferably is substantially equal to the thickness of the laminated body. It is preferable that the first thickness be about 0.9 times or below the sum of the first and second thicknesses of the respective first and second dielectric-layers.

Preferably, the above-described step of forming through-holes is performed so that the state in which the electronic components are connected to the peripheral portions is remaining, at the portion having a length not less than about 50% of the length of the dividing lines for removing the electronic components.

Other preferred embodiments of the present invention provide an electronic component obtained by the above-described manufacturing method.

Furthermore, additional preferred embodiments of the present invention provide an electronic component, which includes an electronic component body having a first and second main surfaces opposed to each other, and side surfaces connecting the first and second main surfaces. Grooves are provided in the side surfaces of this electric component, and each of the grooves has a first length and passes through from the first main surface to the second surface. Each of the grooves also includes a recess which has a second length that is less than the first length and also has an opening formed on the bottom surface of the groove and extending along the longitudinal direction of the groove. In the recess, there is provided an external terminal electrode having the second length.

In the above-described electronic component, it is preferable that the second length is about 0.9 times or below the dimension of the first length.

With regard to the peripheral direction of the side surfaces of the electronic component body, it is preferable that the length of the portion at which there is no groove formed, be not less than about 50% of the length of the overall periphery of the side surfaces.

In the electronic component in accordance with this preferred embodiment of the present invention, the external terminal electrode may be arranged so as to reach the second main surface. Alternatively, the external terminal electrode may be arranged so as not to reach either of the first and second main surfaces.

Also, in the electronic component in accordance with other preferred embodiments of the present invention, the electronic component body may have a lamination structure, and simultaneously may have an inner circuit element.

Furthermore, the electronic component in accordance with preferred embodiments of the present invention may further include a surface mounted device which is mounted on at least one of the first and second main surfaces.

Moreover, the electronic component in accordance with other preferred embodiments of the present invention may further include a metallic cover arranged so as to cover the surface mounted device. In this case, it is preferable that the metallic cover have claws arranged to be disposed in at least one of the grooves, and that these claws be connected to at least one of the external terminal electrodes.

Preferably, the electronic component in accordance with various preferred embodiments of the present invention is used for high-frequency applications.

In accordance with another preferred embodiment of the present invention, an electronic component includes an electronic component body having first and second main surfaces opposed to each other, and side surfaces connecting the first and second main surfaces. In this electronic component, at least one of the first and second main surfaces is a mounting surface on which a surface mounted device is mounted, and in the side surfaces, there are formed grooves each of which has a first length and which passes through from the first main surface to the second surface. In each of the grooves, an external terminal electrode having a second length that less than the first length is provided so as to extend in the longitudinal direction thereof.

Other preferred embodiments of the present invention provide an aggregate electronic component which has first and second main surfaces opposed to each other, and which is arranged so as to remove therefrom a plurality of electronic components by dividing the aggregate electronic component in a direction that is substantially perpendicular to the main surfaces, along predetermined dividing lines.

In the aggregate electronic component in accordance with this preferred embodiment of the present invention, there are provided via-hole conductors each of which has an axial direction size smaller than the thickness size between the first and second main surfaces, and each of which is provided so as to straddle the dividing line, and through-holes passing through the first and second main surfaces, are provided so as to each divide the via-hole conductors. Also, there are provided external terminal electrodes, each including a divided portion of the via-hole conductor that is divided by the through-hole.

In the above-described aggregate electronic component, preferably, the axial direction size of the via-hole conductor is about 0.9 times or below the thickness dimension between the first and second main surfaces.

In this aggregate electronic component, it is preferable that the length of the portion where no through-hole is provided, of the dividing lines for removing the electronic components, be not less than about 50% of the overall length of the dividing lines for removing the electronic components.

This aggregate electronic component may further include a surface mounted device which is mounted on at least one of the first and second main surfaces thereof.

Preferred embodiments of the present invention also provide a mounting structure wherein an electronic component as described above is been mounted on a mother circuit board having connection terminals.

In the mounting structure in accordance with various preferred embodiments of the present invention, the external terminal electrodes of the electronic component and the connection terminals of the mother circuit board are connected via solder fillets, and the height of the solder fillets is defined by the second length of the external terminal electrode.

Preferred embodiments of the present invention also provide an electronic device provided with an electronic component as described above.

Other elements, characteristics, features, and advantages of the present invention will be clear from the following detailed description of preferred embodiments of the present invention in conjunction with the accompanying drawings.

BRIEF DESCRIPTION OF THE DRAWINGS

FIGS. 1A and 1B are perspective views showing the appearance of an electronic component 1 in accordance with a preferred embodiment of the present invention, wherein FIG. 1A is a view as seen from the first main surface 2 side, and FIG. 1B is a view as seen from the second main surface 3 side;

FIGS. 4A and 4B are enlarged views of a portion where a via-hole conductor 13 of the laminated body 18 shown in FIG. 3 is provided, wherein FIG. 4A is a vertical section of the via-hole conductor 13, and FIG. 4B is a cross sectional view thereof;

DETAILED DESCRIPTION OF PREFERRED EMBODIMENTS

Figure 1A:
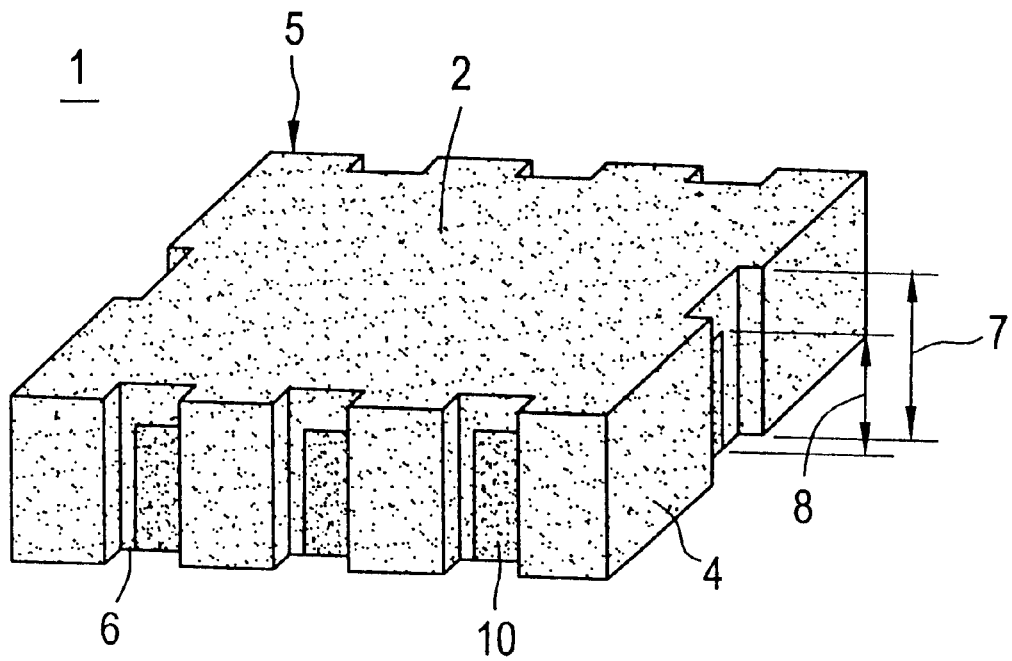
Figure 1B:
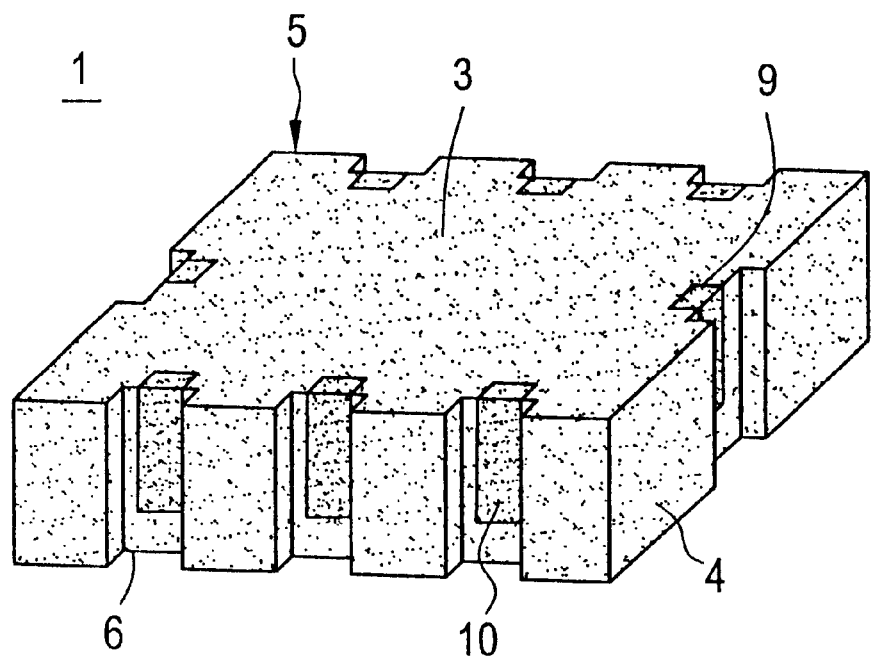

FIGS. 1A and 1B are perspective views showing the appearance of an electronic component 1 in accordance with a preferred embodiment of the present invention, wherein FIGS. 1A and 1B are views showing the electronic component 1 as seen from opposite sides.

The electronic component 1 preferably includes an electronic component body 5 having first and second main surfaces 2 and 3 opposed to each other, and side surfaces 4 connecting the first and second main surfaces 2 and 3. In this preferred embodiment, the electronic component body 5 preferably has a substantially rectangular-parallelepiped or substantially prism shape.

In the side surfaces 4 of the electronic component body 5, there are formed grooves 6 which extend through from the first main surface 2 to the second main surface 3. In this preferred embodiment, three grooves 6 are disposed in each of the longer side portions of the side surfaces 4, and one groove 6 is disposed in each of the shorter side portions thereof. Each of the grooves 6 has the first length 7 corresponding to the thickness of the electronic component body 5.

In each of the grooves 6, a recess 9 which has the second length 8 that is less than the first length 7 and which has an opening formed on the bottom surface of the groove 6, is arranged along the longitudinal direction of the groove 6. In this recess 9, an external terminal electrode 10 having the second length 8 like the recess is provided. In this preferred embodiment, the external terminal electrode 10 is arranged so as not to reach the first main surface 2, but so as to reach the second main surface 3.

Preferably, the second length 8 is about 0.9 times, and preferably about 0.875 times, or below, as large as the first length 7. In a typical example, the first length 7 is about 0.8 mm, and the second length 8 is about 0.7 mm.

With regard to the peripheral direction of the side surfaces 4 of the electronic component body 5, it is preferable that the length of the portion at which there is no groove 6 formed, be not less than about 50%, preferably about 65% of the length of the overall periphery of the side surfaces 4.

In this preferred embodiment, the electronic component 1 is a laminated electronic component, and therefore, the electronic component body 5 has a lamination structure, and also has an inner circuit element, although it is not shown in FIGS. 1A and 1B.

Figure 5A:
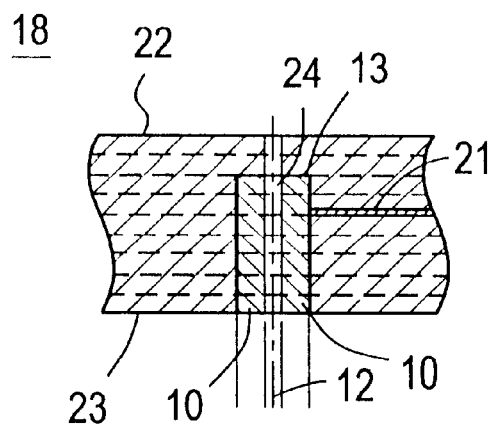
FIGS. 5A and 5B are views corresponding to FIGS. 4A and 4B, FIGS. 5A and 5B showing a through-hole which has been formed so as to divide the via-hole conductor 13.
Figure 5B:
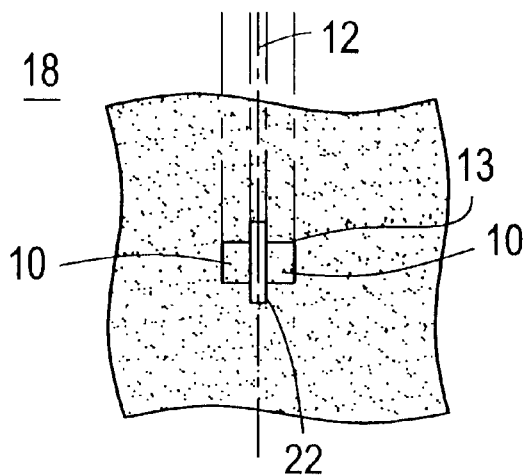
Figure 6:
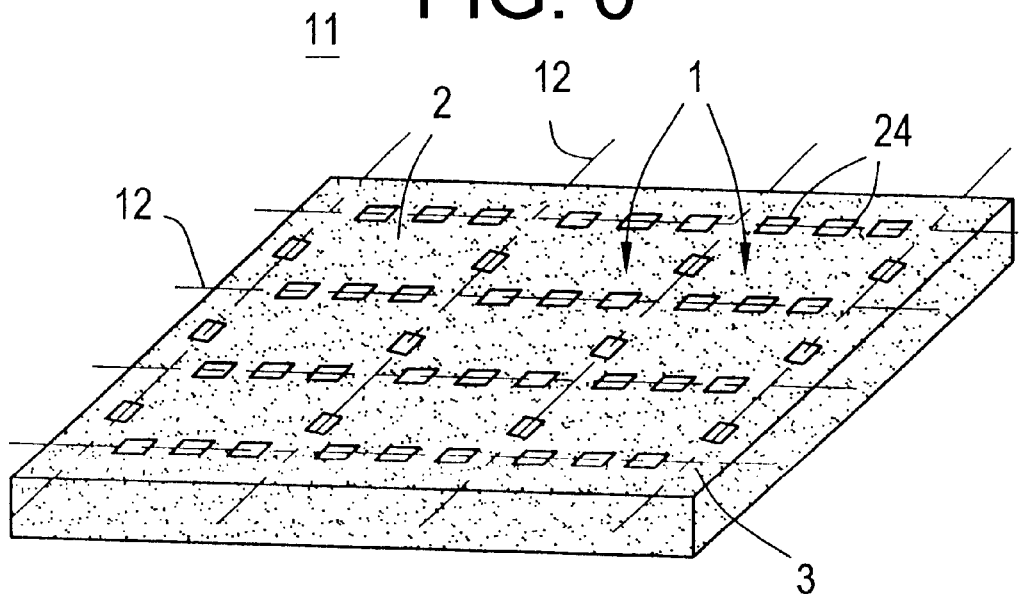
FIG. 6 is a perspective view showing an aggregate electronic component 11 obtained by firing the laminated body 18 after the process showing in FIG. 5.

FIGS. 2 to 6 are explanatory views for a method of manufacturing the above-described electronic component 1. In the manufacturing method shown in FIGS. 2 to 6, in order to obtain an electronic component 1, an aggregate electronic component 11 as shown in FIG. 6 is produced, then the aggregate electronic component 11 is divided along a pre-determined dividing lines 12, and thereby a plurality of electronic components 1 is removed.

Figure 2:
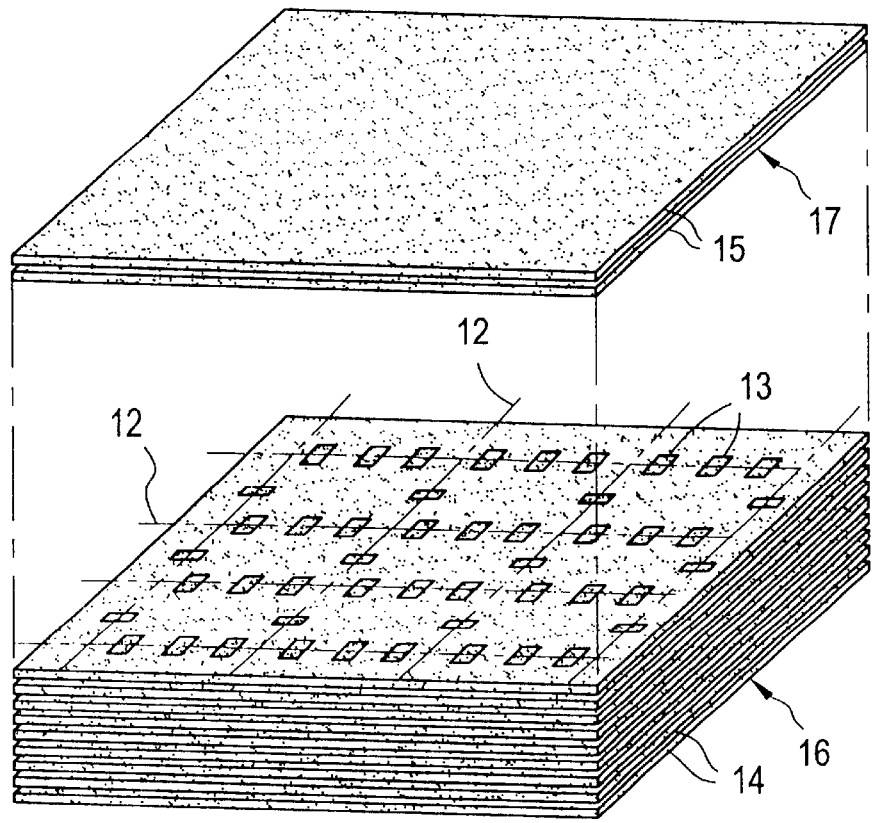
FIG. 2 is a perspective view showing a process of laminating dielectric sheets 14 and 15, the process being performed to manufacture the electronic component 1 shown in FIGS. 1A and 1B.

Referring to FIG. 2, in order to obtain an aggregate electronic component 11, firstly, there are prepared a first dielectric sheet 14 which has via-hole conductors 13 defining external terminal electrodes 10 formed therein, and a second dielectric sheet 15 which does not have such via-hole conductors formed therein. In this preferred embodiment, each of these dielectric sheet 14 and 15 is constituted of a plurality of ceramic green sheets. Also, in order to form via-hole conductors 13, through-holes are provided in the first dielectric sheets 14, and a conductive paste is filled into the through-holes.

Figure 3:
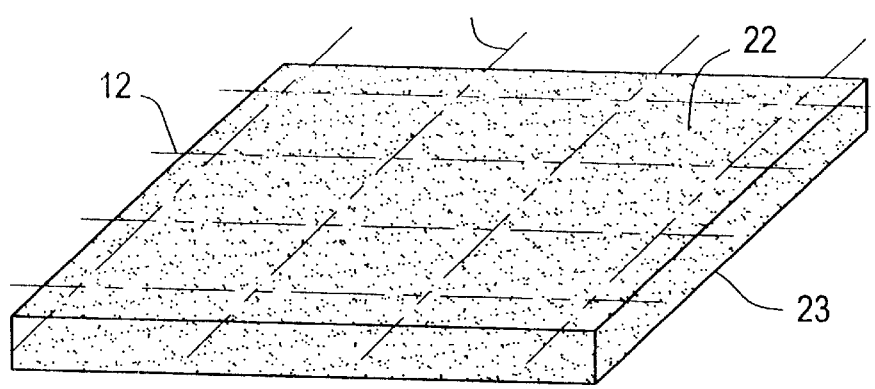
FIG. 3 is a perspective view showing a laminated body 18 obtained through the laminating process shown in FIG. 2.

The above-described first dielectric-layer portion 16 constituted of a predetermined number of first dielectric sheets 14 and second dielectric-layer portion 17 constituted of a predetermined number of second dielectric sheets 15 are laminated and then pressed, whereby a laminated body 18 as shown in FIG. 3 is produced. FIGS. 4A and 4B are enlarged views of a portion where a particular via-hole conductor 13 of the laminated body 18 is provided, wherein FIG. 4A is a vertical section of the via-hole conductor 13, and FIG. 4B is a cross sectional view thereof.

When producing the laminated body 18, as shown in FIG. 4A, the first dielectric-layer portion 16 preferably has a predetermined first thickness 19, and the second dielectric-layer portion 17 preferably has a predetermined first thickness 20. These thicknesses 19 and 20 are determined by the number of the first dielectric sheets 14 defining the first dielectric-layer portion 16, and the number of the second dielectric sheets 15 defining the second dielectric-layer portion 17. When the second length 8 is about 0.9 times or below as large as the first length 7 in the electronic component 1 as described above, the first length 19 is about 0.9 times or below as large as the sum of the first and second thicknesses 19 and 20.

FIG. 4A illustrates an inner conductor film 21 defining an inner circuit element, the inner conductor being a portion of wiring conductors provided in association with the electronic component 1. The inner conductor film 21 preferably includes a conductive paste, and is connected to a via-hole conductor 13.

The inner conductor film 21 in FIG. 4A is illustrated as a representative of inner circuit elements or wiring conductors. It is, therefore, to be understood that illustrations of other inner circuit elements or wiring conductors are omitted in FIGS. 1 to 6.

Next, as shown in FIGS. 5A and 5B, through-holes 24 which pass through the mutually opposed first and second main surfaces 22 and 23 of the laminated body 18, are disposed at the portions where the via-hole conductors 13 of the laminated body 18 are positioned. Thereby, the via-hole conductors are divided, and a portion of each of the via-hole conductors is exposed to the inner surface of the through-hole 24. The dividing lines 12 shown in FIG. 6 are illustrated in FIGS. 2 to 5. As can be seen from FIG. 5, the dividing line 12 passes through the through-hole 24.

Each of the illustrated through-holes 24 preferably has a substantially quadrangular cross-section. However, the cross-sectional shape of the through-hole may be changed into another shape, such as a substantially circular shape. Likewise, each of the illustrated via-holes conductor has a substantially quadrangular cross-section, but the cross-sectional shape of the via-hole conductor may also be changed into another shape, such as a substantially circular shape.

Each of the through-holes 24 each provide grooves 6 formed in the side surfaces of the electronic component body 5 of the electronic component 1. Each of the divided portions of the via-hole conductor 13 divided by the through-hole 24 provides an external terminal electrode 10.

With regard to the peripheral direction of the side surfaces 4 of the electronic component body 5, in order to set the length of the portion at which there is no groove 6 formed to not less than about 50% of the length of the overall periphery of the side surfaces as described above, the formation of through-holes 24 is performed so that the state in which individual electronic components 1 are connected to the peripheral portions is left, at the portion having a length not less than about 50% of the length of the dividing lines 12 for removing the electronic component bodies 5.

Next, the laminated body 18 is fired. Prior to firing, grooves used for facilitating later division of the laminating body may be formed in either main surface 22 or 23, or in both of main surfaces 22 and 23 shown in FIG. 5A. The depth of the grooves is determined by taking it into consideration preventing the laminated body 18 from being inadvertently broken along the grooves when treating the laminated body 18 after firing.

As a result of the firing process, the laminated body 18 is sintered, and an aggregate electronic component 11 as shown in FIG. 6 is obtained. With respect to this aggregate electronic component 11, an external conductor film and a resistor film are formed, overcoating is performed, solder resist is provided, or plating is executed, as desired.

As described above with reference to FIG. 4A, by setting the first thickness 19 to be about 0.9 times or below as large as the sum of the first and second thickness sizes 19 and 20, in other words, by setting the axial direction dimension of the via-hole conductor 13 to be about 0.9 times or below as large as the thickness size between the first and second main surfaces 22 and 23 of the laminated body 18, irregularities and uneven portions are prevented from occurring in the vicinity of the via-hole conductors 13 of the aggregate electronic component 11 after firing, even if a difference in shrinkage occurs during firing between the conductive component included in the via-hole conductors 13 and the ceramic component included in the dielectric-layer portions 16 and 17.

When the above-described steps are completed, since each of a plurality of electronic components 1 included in the aggregate electronic component 11 is electrically independent of one another, characteristics of individual electronic components 1 can be measured via the external terminal electrodes 10 provided by the divided portions of via-hole conductors 13, which divided portions are produced by being cut and divided by dividing lines.

After characteristics have been measured in this manner, with respect to the aggregate electronic component 11 which were judged as a conforming item, mounted components are mounted on at least one of the first and second main surfaces 2 and 3 of each of the electronic components 1 included in the aggregate electronic component 11, as required.

The steps described hereinbefore can be efficiently executed in the state of the aggregate electronic component 11.

As described above, since the length of the portion where no through-holes 24 are provided, of the dividing lines 12 for removing the electronic components 1, is not less than about 50% of the overall length of the dividing lines for removing the electronic components 1, it is possible to prevent the aggregate electronic component 11 from being broken inadvertently, for example, during the above-described treating for characteristics measurement or other processes.

Next, the aggregate electronic component 11 is divided along the dividing lines 12. Thereby, each of a plurality of electronic components 1 as shown in FIGS. 1A and 1B is removed.

Figure 7:
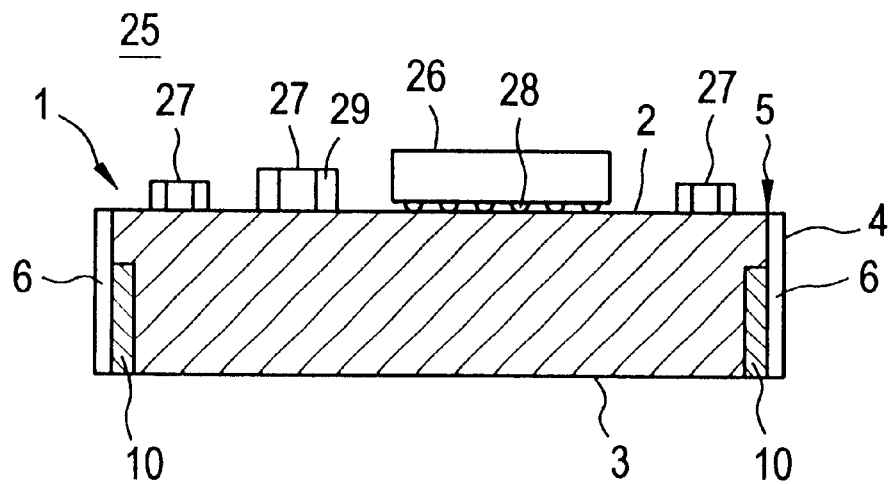
FIG. 7 is a sectional view illustratively showing a high frequency module 25 formed by mounting mounted components 26 and 27 on the electronic component 1 shown in FIGS. 1A and 1B.

FIG. 7 is a sectional view illustratively showing a high frequency module 25 including the electronic component 1 shown in FIGS. 1A and 1B.

Referring to FIG. 7, several surface mounted devices 26 and 27 are mounted on the first main surface 2 of the electronic component body 5, to define a high frequency module 25 using the electronic component 1. In order to allow these mounted devices 26 and 27 to be mounted, an appropriate external conductor film is provided on the first main surface 2 of the electronic component body 5, although it is not shown. The surface mounted device 26, for example a silicon device, is one which is mounted via a bump electrode 28, while the mounted components 27, for example laminated ceramic capacitors, are ones which are mounted via a planar electrodes 29.

Figure 8:
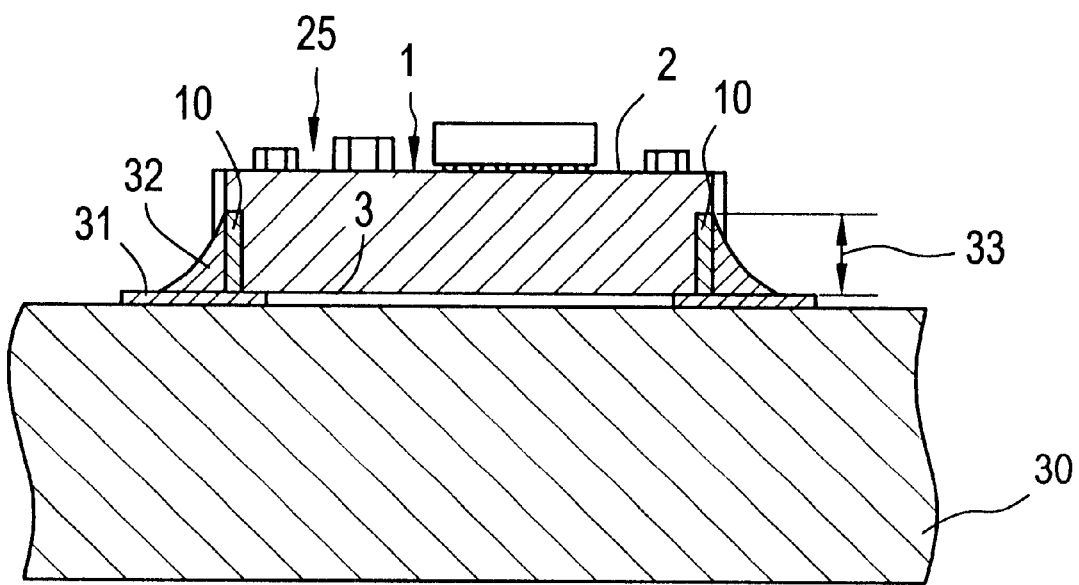
FIG. 8 is a sectional view illustratively showing a high frequency module 25 shown in FIG. 7, which has been mounted on a mother circuit board 30.

FIG. 8 is a sectional view illustratively showing a high frequency module 25 shown in FIG. 7, which has been mounted on a mother circuit board 30.

Referring to FIG. 8, connection terminals 31 are provided on the mother circuit board 30. The external terminal electrodes 10 of the electronic component 1 included in the high frequency module 25 and the connection terminals 31 of the mother circuit board 30 are connected via solder fillets 32. Since the external terminal electrodes 10 are arranged so as not to reach the first main surface 2 of the electronic component body 5, the height 33 of the solder fillets 32 can be reliably defined by the second length 8 (see FIGS. 1A and 1B) of the external terminal electrodes 10. Therefore, the inductance component provided by the solder fillets 32 is controlled by the height of the solder fillets 32. This prevents variations in the inductance component with variations in this height 33 to occur.

Figure 9:
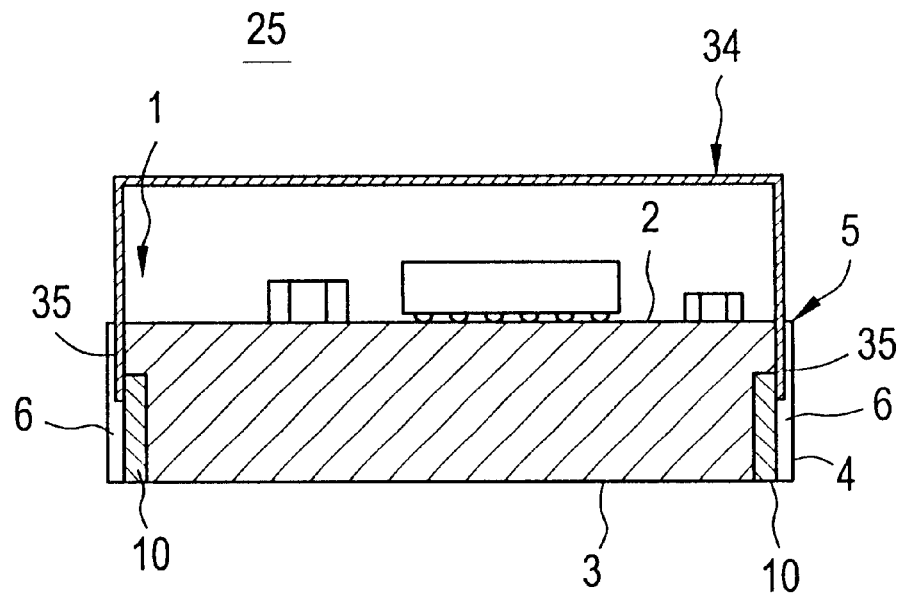
FIG. 9 is a sectional view illustratively showing a state in which the electronic component 1 shown in FIGS. 1A and 1B is covered with a metallic cover 34.

FIG. 9 is a sectional view illustratively showing a state in which the high frequency module 25 shown in FIG. 7 is covered with a metallic cover 34.

Referring to FIG. 9, the metallic cover 34 is arranged so as to cover the first main surface 2 of the electronic component body 5 of the electronic component 1. The metallic cover 32 has claws arranged to be disposed in the grooves 6, and the claws are connected to the external terminal electrodes 10.

Adoption of above-described features facilitates the positioning of the metallic cover 34 with respect to the electronic component body 5, and allows the grounding of the metallic cover 34 to be easily performed via the external terminal electrodes 10.

A resin may be coated on the first main surface 2 of the electronic component body 5 in order to shield the components mounted thereon. The shield structure with resin coating is favorable for further reduction in the thickness of the electronic components 1.

Figure 10:
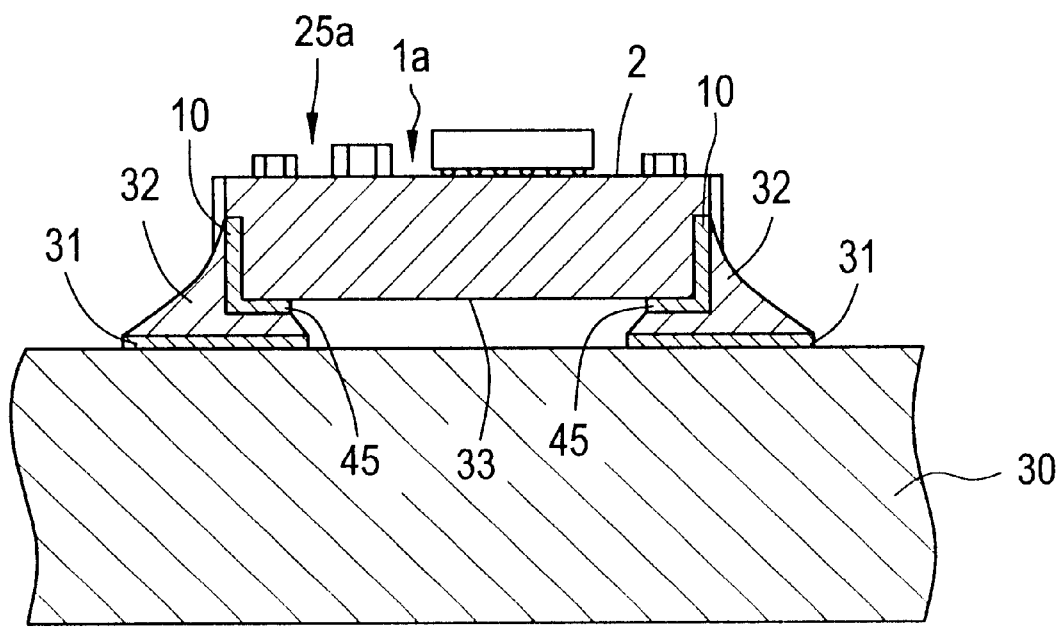
FIG. 10 is a sectional view illustratively showing a state in which a high frequency module 25a including an electronic component 1a in accordance with another preferred embodiment of the present invention has been mounted on the mother circuit board 30, FIG. 10 being a sectional view corresponding to FIG. 8.

FIG. 10 is a sectional view illustratively showing a state in which a high frequency module 25a including an electronic component 1a in accordance with another preferred embodiment of the present invention has been mounted on a mother circuit board 30. This is a sectional view corresponding to FIG. 8. In FIG. 10, the elements corresponding to the elements shown in FIG. 8 are illustrated with the same reference numerals as those shown in FIG. 8, and repeated descriptions will be avoided.

The electronic component 1a shown in FIG. 10 is characterized in that rear-surface electrodes 45 connected to the external terminal electrodes 10 are provided on the second main surface 3 of the electronic component body 5. Adoption of this structure significantly improves the bonding strength of the electronic component 1 with respect to the mother circuit board 30.

The rear-surface electrodes 45 may be formed at the stage of the dielectric sheet 14 before laminating, or may instead be formed after the through-holes 24 shown in FIG. 5 have been formed. Alternatively, the rear-surface electrodes 45 may be formed at the stage after firing shown in FIG. 6.

Figure 11:
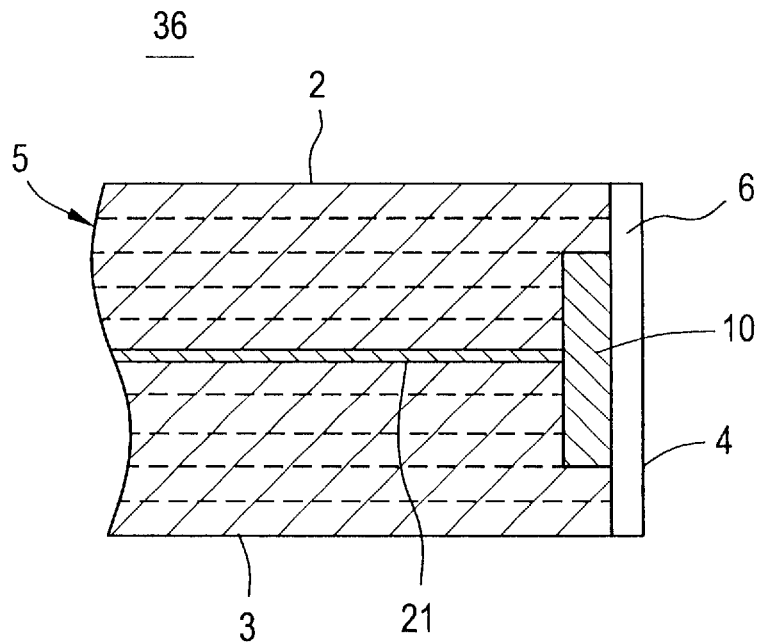
FIG. 11 is a sectional view illustratively showing a portion of an electronic component 36 in accordance with still another preferred embodiment of the present invention.

FIG. 11 is a sectional view illustratively showing a portion of an electronic component 36 in accordance with still another preferred embodiment of the present invention. In FIG. 11, the elements corresponding to the elements shown in FIGS. 1 to 6 are illustrated with the same reference numerals as those shown in FIGS. 1 to 6, and repeated descriptions will be avoided.

Referring to FIG. 11, in an electronic component 36, an external terminal electrode 10 is arranged so as not to reach any of the first and second main surfaces 2 and 3 of the electronic component body 5.

In accordance with the electronic component 36 shown in FIG. 11, on both of the first and second main surfaces 2 and 3, there is no risk that the existence of the external terminal electrodes 10 narrow the mountable area of mounted components. Also, with regard to both sides of the first and second main surfaces 2 and 3, it is possible to prevent irregularities or uneven portions from occurring due to a difference in the shrinkage, during firing, between the via-hole conductors and the dielectric sheets.

Figure 12:
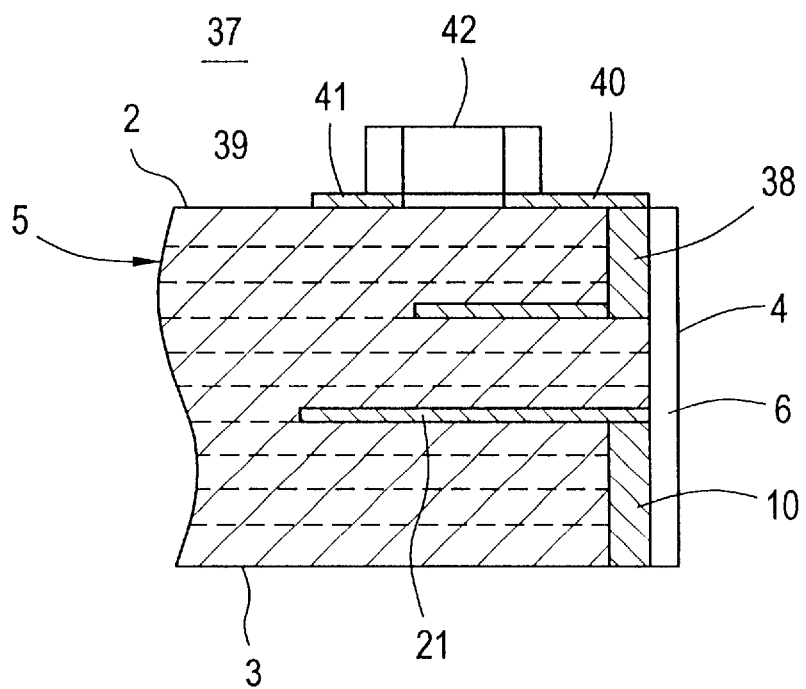
FIG. 12 is a sectional view illustratively showing a portion of an electronic component 37 in accordance with a further preferred embodiment of the present invention.

FIG. 12 is a sectional view illustratively showing a portion of an electronic component 37 in accordance with a further preferred embodiment of the present invention. In FIG. 12, the elements corresponding to the elements shown in FIGS. 1 to 6 are illustrated with the same reference numerals as those shown in FIGS. 1 to 6, and repeated descriptions will be avoided.

In the electronic component 37 shown in FIG. 12, external terminal electrodes 10 are arranged so as to reach the second main surfaces 3, but the axial direction dimension thereof is smaller than that of the electronic component 1 shown in FIGS. 1A and 1B, or others.

Also, in the electronic component 37, connection conductors 38 are provided by a forming method that is similar to that used for forming the external terminal electrode 10. The connection conductor 38 has a similar function to that of the via-hole conductor. For example, in the illustrated preferred embodiment, the connection conductor 38 performs the function of connecting the inner conductor film 39 and an external conductor film 40. The external conductor film 40 is used together with an external conductor film 41 when a mounted component 42 is mounted on the first main surface 2.

Hereinbefore, the present invention has been described with reference to the illustrated preferred embodiments, but various modifications can be made within the scope of the present invention.

In the illustrated preferred embodiments, in order to manufacture the electronic component 1, an aggregate electronic component 11 is preferably produced, and a plurality of electronic components 1 is preferably removed by dividing the aggregate electronic component 11. However, for example, the method for manufacturing the electronic component 1 may instead be such that a laminated body for obtaining a single electronic component 1 is produced, through-holes are formed at portions where via-hole conductors formed in this laminated body are positioned, and peripheral portions are removed by dividing the laminated body along the dividing lines which pass through the through-holes, whereby a single electronic component is removed. In this case, the through-holes are not required to be formed so as to divide via-hole conductors. It is essential only that the through-holes be formed so that a portion of each of the via-hole conductors is exposed to the inner surface of the through-hole.

Furthermore, in various preferred embodiments, the electronic component body 5 has a lamination structure, and simultaneously has inner circuit elements such as inner conductor films 21, but the present invention can be applied to an electronic component body without a laminated structure.

Moreover, in various preferred embodiments, since the external terminal electrodes 10 are preferably formed by dividing the via-hole conductors 13 by the through-holes 24, a recess 9 is provided in each of the grooves 6 formed in the side surfaces 4 of the electronic component body 5, and an external terminal electrode 10 is provided in the recess 9, in the obtained electronic component 1. However, each of the external terminal electrodes may instead be formed by applying a conductive paste on, for example, a predetermined area in the groove.

Also, in various preferred embodiments, dielectric-layer portions 16 and 17 are preferably constituted of ceramic green sheets, but may instead be constituted of sheets formed of another insulating material.

As is evident from the foregoing, in accordance with various preferred embodiments of the present invention, an electronic component preferably includes an electronic component body having a first and second main surfaces opposed to each other, and side surfaces connecting the first and second main surfaces, in which grooves each having a first length and extending from the first main surface to the second surface, are formed in the side surfaces, and in which an external terminal electrode having the second length smaller than the first length, is formed in each of the grooves. Therefore, this electronic component can be arranged so that the external terminal electrodes do not reach at least one of the first and second main surfaces of the electronic component body.

This prevents the mountable area for mounted components on the main surface from being narrowed, in order to inhibit an undesirable electrical short circuit between the mounted components and external terminal electrodes.

When the electronic component body is made of a ceramic material, it is possible to prevent the difference in the shrinkage, during firing, between the conductive component in the via-hole conductors and the ceramic component from causing irregularities or unevenness on the main surfaces of the electronic component body.

Particularly when the second length of the external terminal electrode is about 0.9 times or below as large as the first length of the groove, irregularities or undulation described above are reliably prevented.

When the external terminal electrodes of the electronic component and the connection terminals of the mother circuit board are connected via solder fillets in order to mount the electronic component in accordance with various preferred embodiments of the present invention on the mother circuit board, the height of the solder fillets can be defined by the longitudinal size of the external terminal electrode. This allows variations in the inductance component provided by solder fillet to be eliminated, when this electronic component is applied to a high-frequency application.

Each of the external terminal electrodes are preferably formed in the groove, and hence, when the external terminal electrodes are plated, electrical short circuits can be prevented from occurring between adjacent external terminal electrodes, even if abnormal precipitation of plating films occurs.

In accordance with the manufacturing method for an electronic component of various preferred embodiments of the present invention, a laminated body is produced by laminating a first dielectric-layer portion which has via-hole conductors defining external terminal electrodes formed therein, and a second dielectric-layer portion which does not have such via-hole conductors formed therein at the portions where the via-hole conductors of said first dielectric-layer portion are positioned, through-holes passing through the laminated body, rather than longitudinal grooves, are formed, and thereby a portion of each of the via-hole conductors is caused to be exposed to the inner surface of the through-hole to provide an external terminal electrode.

Therefore, even if the electronic component is thinned, and consequently the laminated body is thinned, the possibility that the laminated body is undesirably broken at stages prior to the division thereof along dividing lines, can be reduced.

Particularly when through-holes are formed so that the state in which electronic components are each connected to the peripheral portions is left, at the portion having a length not less than about 50% of the length of the dividing lines for removing the electronic components, undesired breakage is reliably prevented.

In the manufacturing method for the electronic component in accordance with various preferred embodiments of the present invention, when the above-described laminated body is an aggregate electronic component which is arranged so that a plurality of electronic components can removed therefrom, numerous electronic components can be efficiently manufactured.

In the above-described case, in attempting to form through-holes, when each of the through-holes is formed so as to divide a via-hole conductor, external terminal electrodes of two adjacent electronic components can be simultaneously formed by the formation of a single through-hole.

As described above, in the aggregate electronic component, by forming through-holes so as to divide via-hole conductors and thereby providing external terminal electrodes, a plurality of electronic components can be made to be independent of one another, at the stage where the through-holes have been formed. Therefore, measuring characteristics of each of the electronic components in the state of this aggregate electronic component prior to the division thereof, allows the process of measuring characteristics to be efficiently executed.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A method for manufacturing an electronic component, comprising the steps of:
   producing a laminated body by laminating a first dielectric-layer portion which has a first thickness and which has via-hole conductors defining external terminal electrodes formed therein, and a second dielectric-layer portion which has a second thickness and which does not have any via-hole conductors formed therein at the portions where the via-hole conductors of said first dielectric-layer portion are positioned;
   forming through-holes which pass through mutually opposed first and second main surfaces of said laminated body, at the portions where said via-hole conductors of said laminated body are positioned, and thereby causing a portion of each of said via-hole conductors to be exposed to the inner surface of said through-holes; and
   dividing said laminated body along dividing lines passing through said through-holes, to thereby remove individual electronic components each of which include external terminal electrodes each of is constituted of a portion of one of said via-hole conductors.

2. A method for manufacturing an electronic component in accordance with claim 1, wherein said laminated body is an aggregate electronic component which is arranged so that a plurality of electronic components can be removed by dividing said laminated body along said dividing lines, said step of forming said through-holes and said step of dividing said laminated body are performed on said aggregate electronic component, said step of forming said through-holes includes the step of forming through-holes so as to divide said via-hole conductors, and in the step of dividing said aggregate electronic component, a plurality of said electronic components is removed from said aggregate electronic component.

3. A method for manufacturing an electronic component in accordance with claim 2, further comprising the step of measuring characteristics of each of said electronic components in the state of said aggregate electronic component, before said step of dividing said aggregate electronic component.

4. A method for manufacturing an electronic component in accordance with claim 1, wherein each of said first and second dielectric-layer portions are made of ceramic green sheets, and said method for manufacturing an electronic component further comprises the step of firing said laminated body.

5. A method for manufacturing an electronic component in accordance with claim 1, wherein said first thickness is about 0.9 times or below as large as the sum of said first and second thicknesses.

6. A method for manufacturing an electronic component in accordance with claim 1, wherein said step of forming said through-hole is performed so that the state in which said electronic components are each connected to the peripheral portions is left, at the portion having a length not less than about 50% of the length of said dividing lines for removing said electronic components.

7. An electronic component obtained by a manufacturing method in accordance with claim 1.

8. A mounting structure of an electronic component, said mounting structure comprising an electronic component in accordance with claim 7, said electric component being mounted on a mother circuit board having connection terminals, wherein said external terminal electrodes of said electronic component and said connection terminals of said mother circuit board are connected via solder fillets and the height of said solder fillets is defined by said second length of said external terminal electrode.

9. An electronic device including an electronic component in accordance with claim 7.

* * * * *